(12) United States Patent
Joly et al.

(10) Patent No.: US 11,152,894 B2
(45) Date of Patent: *Oct. 19, 2021

(54) METHODS FOR OPERATING AMPLIFIERS AND RELATED DEVICES

(71) Applicant: SKYWORKS SOLUTIONS, INC., Woburn, MA (US)

(72) Inventors: Christophe M. Joly, Thousand Oaks, CA (US); Xiaodong Xu, Oak Park, CA (US); Eric Joseph Lai, Arcadia, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/430,682

(22) Filed: Jun. 4, 2019

(65) Prior Publication Data

US 2020/0162027 A1  May 21, 2020

Related U.S. Application Data

(63) Continuation of application No. 15/458,918, filed on Mar. 14, 2017, now Pat. No. 10,312,864, which is a
(Continued)

(51) Int. Cl.

| | |
|---|---|
| *H03F 3/72* | (2006.01) |
| *H03F 1/02* | (2006.01) |
| *H03F 1/56* | (2006.01) |
| *H03F 3/195* | (2006.01) |
| *H03F 3/24* | (2006.01) |

(Continued)

(52) U.S. Cl.
CPC ......... *H03F 1/0222* (2013.01); *H03F 1/0277* (2013.01); *H03F 1/56* (2013.01); *H03F 3/19* (2013.01); *H03F 3/195* (2013.01); *H03F 3/245* (2013.01); *H03F 3/60* (2013.01); *H03F 3/68* (2013.01); *H03F 3/72* (2013.01); *H04B 1/04* (2013.01); *H04B 1/44* (2013.01); *H03F 2200/111* (2013.01); *H03F 2200/204* (2013.01); *H03F 2200/222* (2013.01); *H03F 2200/387* (2013.01); *H03F 2200/411* (2013.01); *H03F 2200/429* (2013.01); *H03F 2200/451* (2013.01); *H03F 2203/7206* (2013.01);
(Continued)

(58) Field of Classification Search
CPC ... H03F 3/72; H03F 3/68; H03F 3/191; H03F 3/193
USPC .................. 330/51, 295, 302, 306
See application file for complete search history.

(56) References Cited

U.S. PATENT DOCUMENTS

| | | | | |
|---|---|---|---|---|
| 4,565,972 A | * | 1/1986 | Kaegebein | .............. H03F 3/195 330/124 D |
| 6,111,459 A | * | 8/2000 | Nishijima | ............... H03F 3/602 330/124 D |

(Continued)

*Primary Examiner* — Steven J Mottola
(74) *Attorney, Agent, or Firm* — Chang & Hale LLP

(57) ABSTRACT

Methods for operating amplifiers and related devices. In some embodiments, a method for amplifying a signal can include partially amplifying a signal with a common amplification stage. The method can further include providing a bias signal to a selected one of a plurality of dedicated amplification stages each coupled to the common amplification stage and including an output node, such that the selected dedicated amplification stage further amplifies the partially amplified signal and provides the further amplified signal at the respective output node.

17 Claims, 7 Drawing Sheets

Related U.S. Application Data continuation of application No. 14/320,071, filed on Jun. 30, 2014, now Pat. No. 9,595,921.

(51) Int. Cl.
  *H03F 3/68* (2006.01)
  *H03F 3/60* (2006.01)
  *H03F 3/19* (2006.01)
  *H04B 1/04* (2006.01)
  *H04B 1/44* (2006.01)

(52) U.S. Cl.
  CPC ............. *H03F 2203/7209* (2013.01); *H03F 2203/7236* (2013.01); *H04B 2001/0408* (2013.01)

(56) References Cited

U.S. PATENT DOCUMENTS

| | | | |
|---|---|---|---|
| 7,567,128 B2 * | 7/2009 | Oka | H03F 1/56 330/302 |
| 10,312,864 B2 * | 6/2019 | Joly | H03F 3/68 |
| 2006/0132232 A1 * | 6/2006 | Baree | H03F 1/0261 330/51 |

* cited by examiner

METHODS FOR OPERATING AMPLIFIERS AND RELATED DEVICES

CROSS-REFERENCE TO RELATED APPLICATION(S)

This application is a continuation of U.S. application Ser. No. 15/458,918 filed Mar. 14, 2017, entitled POWER AMPLIFIER HAVING SELECTIVE SIGNAL PATHS, which is a continuation of U.S. application Ser. No. 14/320,071 filed Jun. 30, 2014, entitled POWER AMPLIFIER HAVING A COMMON INPUT AND A PLURALITY OF OUTPUTS, the benefits of the filing dates of which are hereby claimed and the disclosures of which are hereby expressly incorporated by reference herein in their entirety.

BACKGROUND

Field

The present disclosure relates to radio-frequency power amplifiers.

Description of the Related Art

In radio-frequency (RF) applications, a power amplifier (PA) typically receives an RF signal from a transceiver through an input, and amplifies the RF signal for transmission through an output, to be routed to an antenna. Such a PA can provide amplification functionality for a plurality of frequency bands. Routing of an amplified RF signal for a selected frequency band typically involves a switch implemented on the output side of the PA.

SUMMARY

In some implementations, the present disclosure relates to a power amplifier that includes a plurality of signal paths having a common input node. Each signal path includes a dedicated amplifier stage, and each signal path is configured to be capable of amplifying a radio-frequency (RF) signal received at the common input node. The power amplifier further includes a bias selector configured to provide a bias signal to the dedicated amplifier stage of a selected one of the plurality of signal paths to thereby allow amplification of the RF signal through the selected signal path.

In some embodiments, each signal path can further include a dedicated output node such that the amplified RF signal leaves the power amplifier through the dedicated output node of the selected signal path. In some embodiments, each signal path can further include a dedicated harmonic trap circuit.

In some embodiments, the bias selector can include an SPNT switch having a pole and N throws, with the quantity N being at least the number of signal paths. The quantity N can be equal to the number of signal paths. The SPNT switch can be configured to receive a bias signal through the pole and provide the bias signal to the dedicated amplifier stage through a corresponding throw.

In some embodiments, the plurality of signal paths can share a common amplifier stage. The common amplifier stage can be a first amplifier stage in each signal path. The dedicated amplifier stage can be a second amplifier stage in each signal path.

According to a number of implementations, the present disclosure relates to a method for amplifying radio-frequency (RF) signals. The method includes providing a plurality of signal paths having a common input node, with each signal path including a dedicated amplifier stage, and each signal path being configured to be capable of amplifying a radio-frequency (RF) signal received at the common input node. The method further includes selecting one of the plurality of signal paths to amplify the RF signal. The method further includes routing a bias signal to the dedicated amplifier stage of the selected signal path to thereby allow amplification of the RF signal through the selected signal path.

In a number of implementations, the present disclosure relates to a semiconductor die that includes a substrate and a common input node formed on the substrate. The die further includes a plurality of signal paths formed on the substrate and connected to the common input node. Each signal path includes a dedicated amplifier stage, and each signal path is configured to be capable of amplifying a radio-frequency (RF) signal received at the common input node. The die further includes a bias selector formed on the substrate and configured to provide a bias signal to the dedicated amplifier stage of a selected one of the plurality of signal paths to thereby allow amplification of the RF signal through the selected signal path.

In some embodiments, each signal path can further include a dedicated output node such that the amplified RF signal leaves the die through the dedicated output node of the selected signal path. In some embodiments, the die can be configured as an HBT die. In some embodiments, the substrate can include a GaAs substrate.

In some teachings, the present disclosure relates to a power amplifier module that includes a packaging substrate configured to receive a plurality of components. The module further includes a power amplifier implemented on the packaging substrate. The power amplifier includes a plurality of signal paths having a common input node, with each signal path including a dedicated amplifier stage, and each signal path being configured to be capable of amplifying a radio-frequency (RF) signal received at the common input node. The power amplifier further includes a bias selector configured to provide a bias signal to the dedicated amplifier stage of a selected one of the plurality of signal paths to thereby allow amplification of the RF signal through the selected signal path. The module further includes a plurality of connectors configured to provide electrical connections between the power amplifier and the packaging substrate.

In some embodiments, the power amplifier can be implemented on a first die such as an HBT die. In some embodiments, at least some of the bias selector can be implemented on the first die. In some embodiments, substantially all of the bias selector can be implemented on the first die. In some embodiments, at least some of the bias selector can be implemented external to the first die. In some embodiments, substantially all of the bias selector can be implemented on a second die.

In some embodiments, each signal path can further include a dedicated output node such that the amplified RF signal leaves the power amplifier through the dedicated output node of the selected signal path. The power amplifier can further include a dedicated matching network connected to each dedicated output node. The dedicated matching network can be implemented off of a die associated with the amplifier stages and on the packaging substrate. The signal paths having their respective dedicated amplifier stages and their corresponding matching networks can be configured to increase power efficiency of the power amplifier.

In a number of implementations, the present disclosure relates to a radio-frequency (RF) device that includes a transceiver configured to process RF signals. The RF device further includes an antenna in communication with the transceiver and configured to facilitate transmission of an amplified RF signal. The RF device further includes a power amplifier (PA) module connected to the transceiver and configured to generate the amplified RF signal. The PA module includes a plurality of signal paths having a common input node, with each signal path including a dedicated amplifier stage, and each signal path being configured to be capable of amplifying an RF signal received at the common input node. The PA further includes a bias selector configured to provide a bias signal to the dedicated amplifier stage of a selected one of the plurality of signal paths to thereby allow amplification of the RF signal through the selected signal path and yield the amplified RF signal.

In some embodiments, the PA module can further include a dedicated matching network connected to an output node associated with each signal path. In some embodiments, the RF device can include a wireless device.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

As the number of bands covered by some wireless devices (e.g., cellular phones) is increased, multi-mode multi-band (MMMB) power amplifiers are becoming more common. In operation, a transceiver typically drives a radio-frequency (RF) signal into a common input of a power amplifier (PA). Upon amplification by the PA, the RF signal exits the PA and typically goes through a matching network before being routed to a selected one of a plurality of band-specific paths by an output switch external to the PA.

Figure 1:
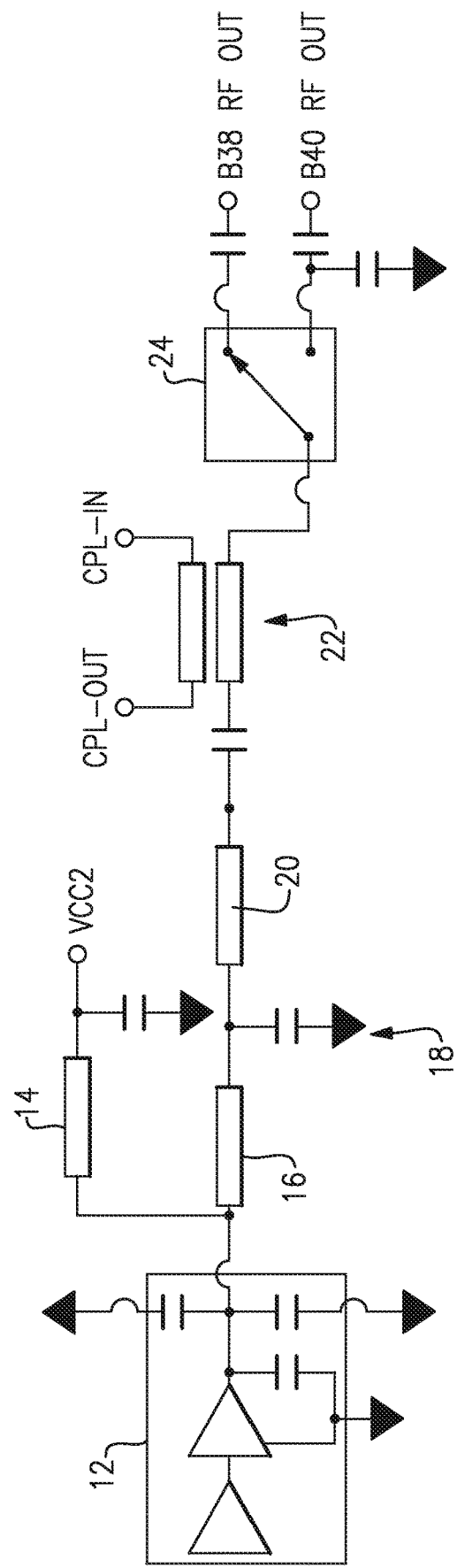
FIG. 1 shows an example radio-frequency (RF) amplification configuration where an output of a power amplifier (PA) is routed to two example band-specific paths via an output switch.

In the context of two example band-specific paths "B38" and "B40," FIG. 1 schematically depicts the foregoing configuration. A power amplifier 12 is shown to include two example stages, and an output of the second stage is shown to pass through a harmonic trap circuit before exiting the PA 12. In some embodiments, such a PA can be, for example, a bipolar junction transistor (BJT) PA such as a heterojunction bipolar transistor (HBT) PA, Si or SiGe based PA, etc. Thus, the example PA 12 has one input and one output. The output of the PA 12 is shown to be connected to a matching circuit 16 which is depicted as including a capacitive coupling 18 to ground, another matching circuit 20, a DC block, and a coupler 22 (e.g., to monitor output power). The amplified and matched RF signal can then be routed to a "B38" RF output or a "B40" RF output by an output switch 24. Examples of such an output switch (24) can include a pseudomorphic high electron mobility transistor (pHEMT) switch, a CMOS switch, a BiHEMT switch, a field-effect transistor (FET) switch, and a silicon-on-insulator (SOI) switch.

There are some drawbacks associated with use of such an output switch (24). For example, the switch can be relatively costly. In another example, performance degradation can occur in the switch 24 due to a relatively large matching bandwidth associated with the amplification circuit that includes the PA 12 (e.g., added mismatch, ohmic losses, other losses and non-linearities). In yet another example, reliability issues (e.g., breakdown voltage and electrostatic discharge) can present challenges.

Figure 2:
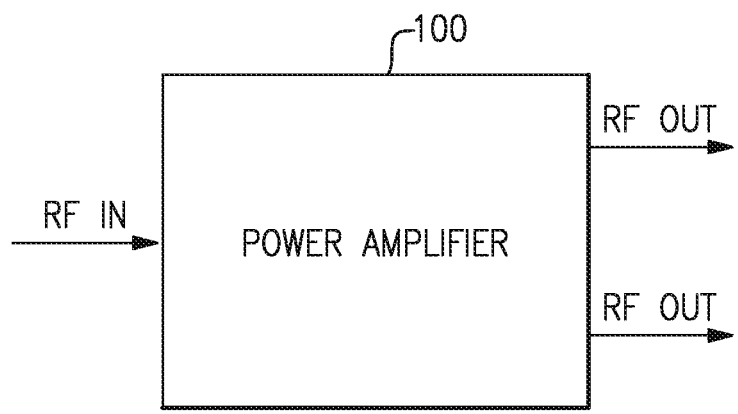
FIG. 2 shows a PA having an input for receiving an RF signal, and a plurality of outputs, where each of the outputs can be associated with a unique amplification path starting at the input.

FIG. 2 shows that in some implementations, the present disclosure relates to a power amplifier (PA) 100 having an input (RF IN) for receiving an RF signal. The PA 100 is shown to have a plurality of outputs (RF OUTs). As described herein, each of the outputs can be associated with a unique amplification path starting at or near the input (RF IN). Various examples of such outputs formed within the PA, as well as benefits that can be realized, are described herein in greater detail.

In some embodiments, a PA can be implemented on a given die. In such embodiments, a component being "within the PA" can include a configuration where the component is also on the same die as the PA. Such a die can include an input node (e.g., RF IN) and output nodes coupled to the input node through their respective amplification paths.

In some embodiments, a PA and related circuits can be described in an architecture context, independent of specific implementations (such as on a die). In such embodiments, a component being "within the PA" can include a configuration where the component is disposed between an input node (e.g., RF IN) and output nodes before the matching network.

Figure 3:
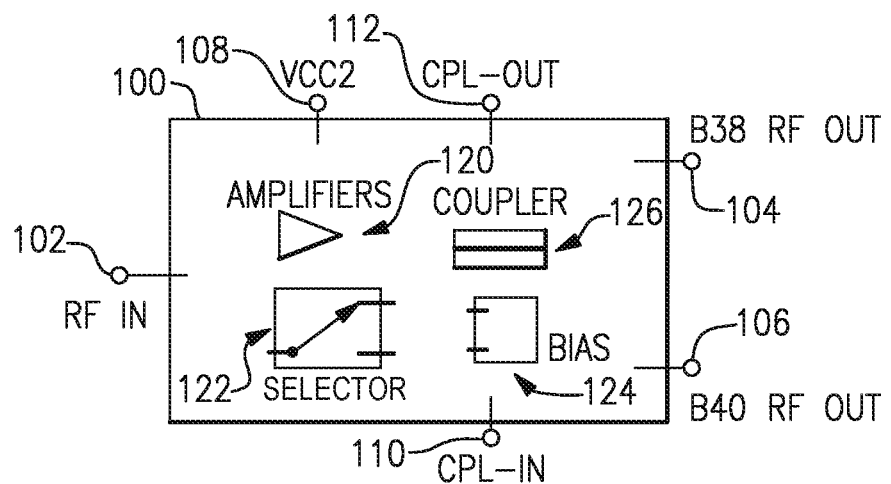
FIG. 3 shows examples of components that can be included in the PA of FIG. 2.

FIG. 3 shows examples of components that can be included in the PA 100. A number of connection nodes can be provided to facilitate various input(s) and output(s) associated with the PA 100. For example, an input node 102 is shown to facilitate receiving of an RF signal, and output nodes 104, 106 are shown to facilitate outputting of amplified RF signals for the respective bands. Although described in the context of the example B38 and B40 bands, it will be understood that one or more features of the present disclosure can also be applied in other bands. For example, B1 and B2 bands can benefit from one or more features as described herein. Other bands can also be utilized. Other I/O nodes such as a voltage supply node 108 (e.g., VCC), as well as input/output coupler nodes 110, 112 can also be provided.

The PA 100 can include a plurality of amplifier stages 120, and such stages can be arranged to form a plurality of amplification paths within the PA 100. Examples of how such amplification paths are described herein in greater detail.

The PA 100 can also include a bias component 124 configured to facilitate providing of bias signals to the amplifier stages 120. Such biasing of the amplifier stages 120 can be facilitated by a bias selector 122 configured to route bias signals to different amplifier stages 120.

In some implementations, the bias selector 122 can be utilized to select an amplification path being operated. Thus, by utilizing such a selector 122, different amplification paths can be separated out within the PA 100. Examples of such different amplification paths are described herein in greater detail. In the various examples described herein, the selector 122 is depicted as a switch. However, it will be understood that such selection functionality may or may not involve a switch. For example, the selector 122 can be implemented as a circuit that turns on a voltage or current source in a selected path. Such a selection functionality can be facilitated by, for example, a PA controller 180 as described herein (e.g., FIGS. 6-9).

In some embodiments, one or more couplers 126 can be disposed within the PA 100. Such couplers can be configured to, for example, monitor powers of PA outputs.

In the example of FIG. 3, it will be understood that the various components can be connected appropriately to provide desired functionalities for the PA 100. Examples of such connected configurations are described herein in greater detail.

Figure 4:
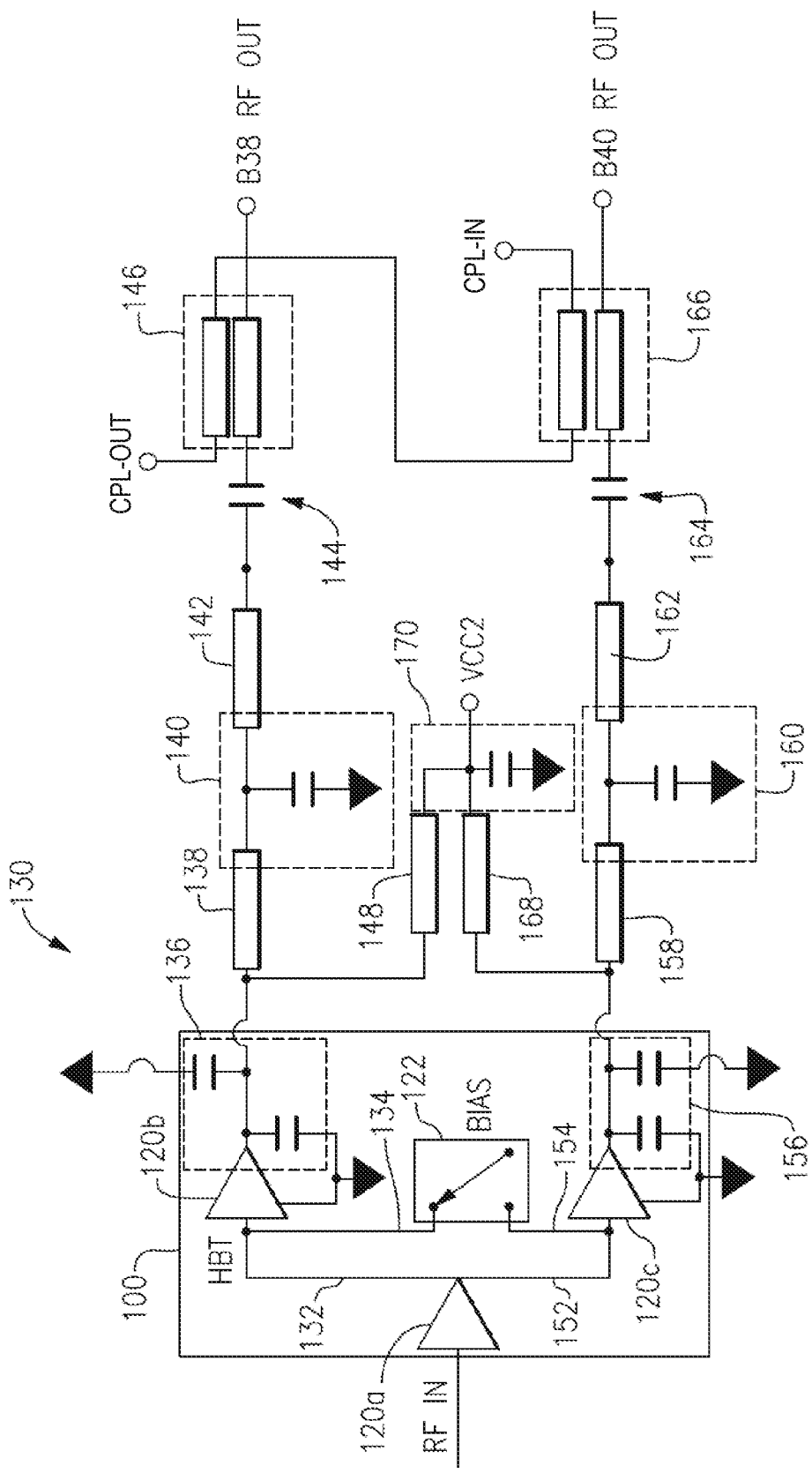
FIG. 4 shows a more detailed example configuration of the PA of FIG. 3.

FIG. 4 shows an example configuration 130 where a PA 100 having a plurality outputs based on a common input (RF IN) is connected to matching networks to yield example matched outputs B38 RF OUT and B40 RF OUT. For the purpose of description, the example PA 100 is shown to include two amplification paths, each with two amplification stages. It will be understood that other numbers of amplification paths and amplification stages are also possible.

An RF signal entering the PA 100 through the RF IN input is shown to be amplified by a common first amplifier stage 120a. Although not shown in FIG. 4, the first amplifier stage 120a can be biased to facilitate its operation.

An output of the first stage 120a is shown to be provided to two paths 132, 152. The first path 132 is connected to an input of a second amplifier stage 120b, and the second path 152 is connected to an input of a second amplifier stage 120c. An output of the second amplifier stage 120b can be coupled to a harmonic trap generally indicated as 136. Similarly, an output of the second amplifier stage 120c can be coupled to a harmonic trap generally indicated as 156. The two amplification paths are shown to exit the PA 100.

The PA 100 is shown to further include a bias selector 122 configured to direct a bias signal to one or more amplifier stages of to the selected amplification path. In the example shown, the bias selector 122 is configured to direct the bias signal to the second stage 120b of the first amplification path, to thereby allow operation of the first amplification path. In such a state, the second stage 120c of the second amplification path is not operational, and therefore does not receive a bias signal, or it may receive a bias signal corresponding to a non-operational state.

In some embodiments, the PA 100 can be implemented utilizing, for example, HBT process. In the context of such a configuration, the bias selector 122 can include one or more FET switches configured to provide, for example, a single-pole-double-throw (SPDT) switching functionality. In such an example, the pole can be connected to a bias signal source (e.g., a bias circuit), and each of the two throws can be connected to the corresponding base (of the second stage transistor 120b or 120c).

Each of the second stages 120b, 120c of the first and second amplification paths are shown to be provided with a supply voltage (e.g., VCC2) through a decoupling capacitance (e.g., a capacitor) 170. The supply voltage provided to the second stage 120b is shown to be passed through an inductive element (e.g., feed line) 148. Similarly, the supply voltage provided to the second stage 120c is shown to be passed through an inductive element (e.g., feed line) 168.

In the example configuration 130 of FIG. 4, the output from the first amplification path of the PA 100 is shown to be connected to the "B38 RF OUT" node through a signal path that includes a matching circuit 138, a matching component 140, another matching component 142, a DC-block capacitor 144, and a coupler 146. The foregoing components can be configured based on properties of RF signals associated with the example B38 band. In the foregoing example, the matching components are depicted as a low pass element which is a common configuration. However, it will be understood that other configurations can also be implemented.

Similarly, the output from the second amplification path of the PA 100 is shown to be connected to the "B40 RF OUT" node through a signal path that includes a matching circuit 158, a matching component 160, another matching component 162, a DC-block capacitor 164, and a coupler 166. The foregoing components can be configured based on properties of RF signals associated with the example B40 band.

An architecture such as the example configuration 130 of FIG. 4 can provide advantageous features when compared to the example configuration 10 of FIG. 1. For example, power efficiency of the PA 100 can be improved significantly (e.g., 5 to 10 points) over that of FIG. 1, therefore generally improving system performance. Such an increase in power efficiency may be due to dedicated match circuits and dedicated harmonic loading for each of the two signals paths between the PA 100 and the RF OUT nodes, thereby reducing mismatch and ohmic losses. In another example, power added efficiency (PAE) can also be increased by eliminating the output switch (24 in FIG. 1).

In some implementations, the foregoing dedicated matching circuits can result in an increased size of the matching network. However, such an increase in matching network size can be compensated by the elimination of the output switch (24 in FIG. 1).

Figure 5:
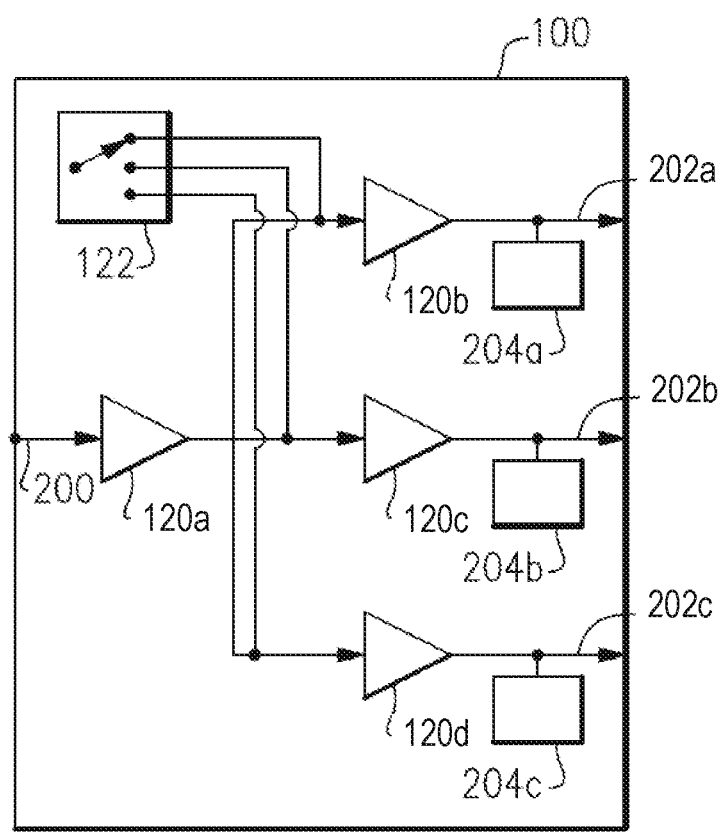
FIG. 5 shows that the PA of FIG. 3 can include more than two signal paths sharing a common input.

In the various examples described in reference to FIGS. 2-4, two signal paths are shown to originate from a common input. It will be understood that other number of signal paths can also be implemented from a given input. By way of an example, FIG. 5 shows a PA 100 having three signal paths sharing a common input 200. An input RF signal is shown to be amplified by a common first amplifier stage 120a. An output of the first stage 120a is shown to be connected to three amplification paths, with the first path having a stage 120b, a harmonic trap 204a, and a PA output 202a. Similarly, the second path has a stage 120c, a harmonic trap 204b, and a PA output 202b. Similarly, the third path has a stage 120d, a harmonic trap 204c, and a PA output 202c. In some embodiments, each of the PA outputs 202a, 202b, 202c can be connected to, for example, a dedicated matching network and a coupler. In the examples of FIGS. 4 and 5, it will be understood that although the PAs are described as having a harmonic trap for each output path, such harmonic traps may or may not be needed in some applications.

Similar to the two-path example of FIG. 4, amplification path selection among the three paths can be facilitated by a bias selector 122. Such a selector can be configured in a number of ways to yield, for example, SP3T functionality. In such an example, the pole can be connected to a bias signal source (e.g., a bias circuit), and each of the three throws can be connected to the corresponding base (of the second stage transistor 120b, 120c or 120d).

In the examples described in reference to FIGS. 4 and 5, the first amplifier stage 120a is common to the plurality of amplification paths. It will be understood that other configurations are also possible. For example, separation into different amplification paths can occur after common first and second stages, so that each path has its own third stage. There can be a number of different configurations that can be implemented utilizing one or more features of the present disclosure.

In some embodiments, a PA 100 having one or more features as described herein can be implemented on a semiconductor die. Although described in the context of an example HBT die, it will be understood that one or more features of the present disclosure can be implemented on other types of die.

Figure 6:
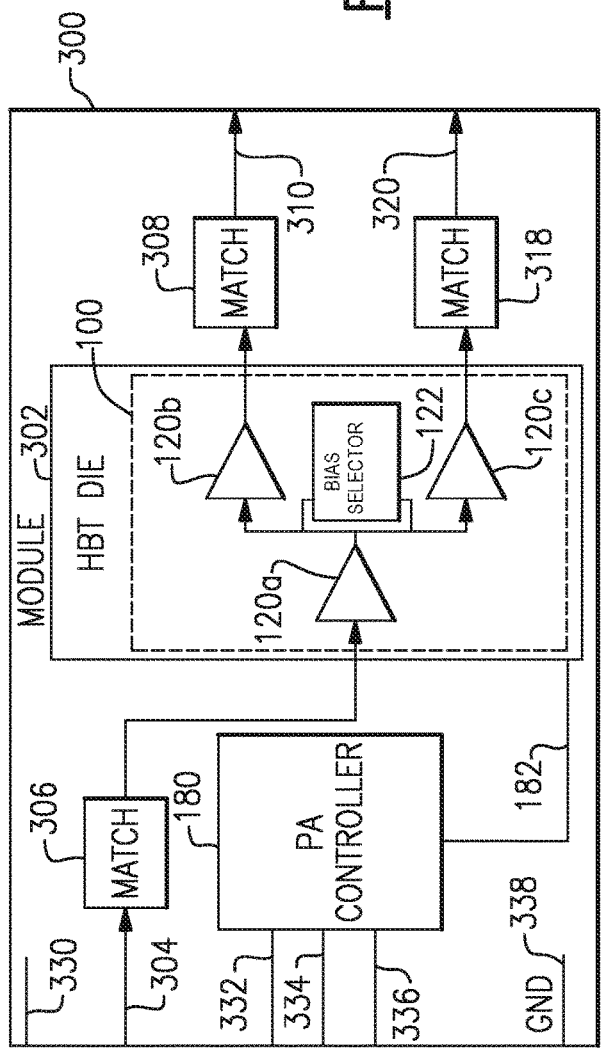
FIG. 6 shows that in some embodiments, one or more features as described herein can be implemented in a module.
Figure 7:
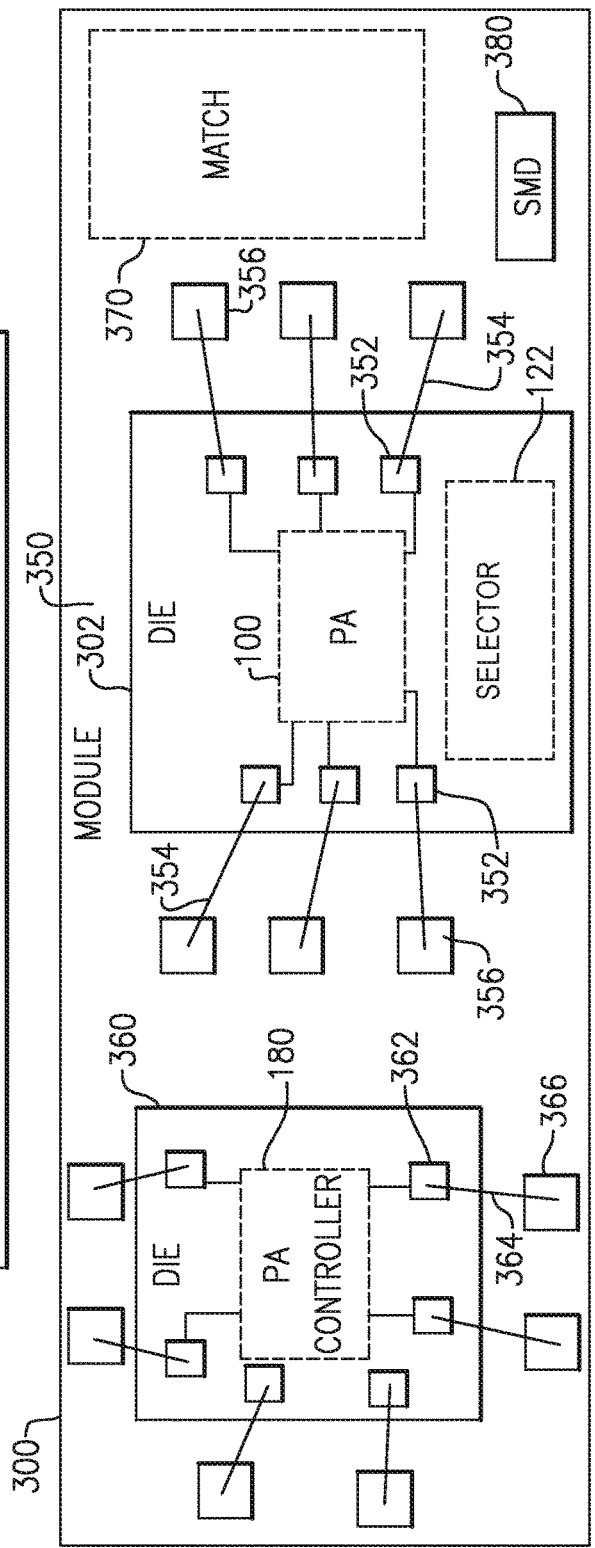
FIG. 7 shows an example where such the module of FIG. 6 is a packaged module.

In some implementations, one or more features described herein can be included in a module. FIG. 6 schematically depicts an example module 300, and FIG. 7 shows an example where such a module can be implemented as a packaged module.

In FIG. 6, the example module 300 is shown to include a PA die 302 that includes a PA 100 having a plurality of amplification paths connected to a common input as described herein. The PA die 302 is shown to be interconnected with a PA controller 180 (line 182). The PA controller 180 can be configured to provide control signals (e.g., bias signals and signals for selecting the amplification path as described herein) for the PA 100. In some embodiments, the PA controller 180 can be implemented in a die that is separate from the PA die 302. In some embodiments, the PA controller 180 can be implemented in the same die as the PA die 302. In some embodiments, some of the PA controller 180 can be implemented in the same die as the PA die 302, and some of the PA controller 180 can be implemented outside of the PA die 302 (e.g., in a separate die). In some embodiments, the PA controller 180 can also be implemented outside of the module 300 (e.g., on a separate module or package) on which the PA die 302 is implemented.

The module 300 can include connection paths 332, 334, 336 that facilitate various operations of the PA controller 180. The connection paths 332, 334, 336 can include, for example, connections for providing various currents and/or voltages as described herein. The module 300 can also include other connection paths 330, 338 to facilitate, for example, grounding and other power and/or signals.

In the example module 300, the PA 100 is shown to include two example amplification paths. However, it will be understood that other numbers of paths can be implemented. In the context of the two amplification paths, the first path is shown to include amplifier stages 120a and 120b, and the second path is shown to include amplifier stages 120a and 120c. An output of the first path is shown to be connected to a matching circuit 308 so as to yield a matched output 310.

Similarly, an output of the second path is shown to be connected to a matching circuit 318 so as to yield a matched output 320.

In the example packaged module 300 of FIG. 7, a PA 100 as described herein is shown to be implemented on a die 302. Such a die can be fabricated using a number of semiconductor process technologies. The die 302 can include a plurality of electrical contact pads 352 configured to allow formation of electrical connections 354 such as wirebonds between the die 302 and contact pads 356 formed on a packaging substrate 350.

A separate die 360 having a PA controller circuit 120 as described herein is shown to be mounted on the substrate 350. Such a die can be fabricated using a number of semiconductor process technologies. The die 360 can include a plurality of electrical contact pads 362 configured to allow formation of electrical connections 364 such as wirebonds between the die 360 and contact pads 366 formed on the packaging substrate 350.

The packaging substrate 350 can be configured to receive a plurality of components such as the die 302, 360 and one or more SMDs (e.g., 380). In some embodiments, the packaging substrate 350 can include a laminate substrate.

In the example packaged module 300, a matching network 370 can be implemented on or within the substrate 350. In some embodiments, some or all of the matching network 370 can be implemented as an integrated passive device (IPD) utilizing, for example, SOI die, GaAs die, etc. Such a matching network 370 can include some or all of the matching circuits 308, 318 described in reference to FIG. 6.

In some embodiments, the module 300 can also include one or more packaging structures to, for example, provide protection and facilitate easier handling of the module 300. Such a packaging structure can include an overmold formed over the packaging substrate 350 and dimensioned to substantially encapsulate the various circuits and components thereon.

It will be understood that although the module 300 is described in the context of wirebond-based electrical connections, one or more features of the present disclosure can also be implemented in other packaging configurations, including flip-chip configurations.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 8:
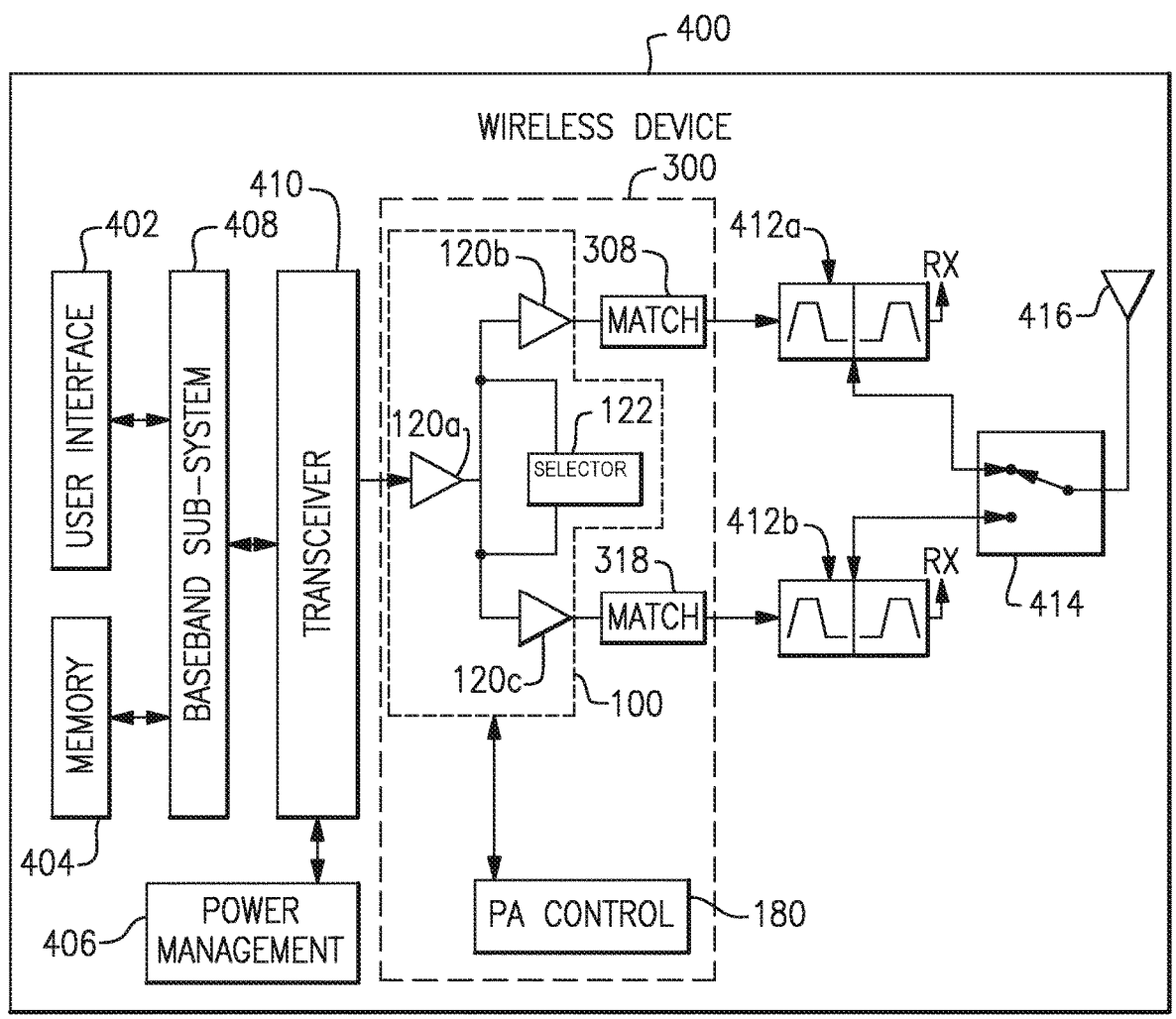
FIG. 8 shows an example wireless device having one or more advantageous features as described herein, implemented in a frequency-division duplexing (FDD) configuration.

FIG. 8 schematically depicts an example wireless device 400 having one or more advantageous features described herein. A PA 100 having one or more features as described herein can be part of a module 300. The PA 100 is shown to be controlled by a PA control circuit 180. The module 300 is shown to further include matching circuits 308, 318.

The PA 100 can receive RF signals from a transceiver 410 that can be configured and operated in known manners. The transceiver 410 can be configured to generate the RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 is also shown to be connected to a power management component 406 that is configured to manage power for the operation of the wireless device. Such power management can also control operations of the baseband sub-system 408 and the module 300.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 400, matched outputs of the module 300 are shown to be routed to an antenna 416 via their respective duplexers 412a, 412b and a band-selection switch 414. The band-selection switch 414 can include, for example, a single-pole-double-throw (e.g., SPDT) switch to allow selection of an operating band (e.g., Band 1). Although depicted in the context of the two-band output of the module 300, it will be understood that the number of operating bands can be different. In configurations where multiple bands are involved (from the outputs of the PA 100 and/or other PA(s) not shown), such a band-selection switch can have, for example, an SPMT (single-pole-multiple-throw) configuration.

In some embodiments, each duplexer 412 can allow transmit and receive operations to be performed simultaneously using a common antenna (e.g., 416). In FIG. 8, received signals are shown to be routed to "Rx" paths (not shown) that can include, for example, a low-noise amplifier (LNA).

Figure 9:
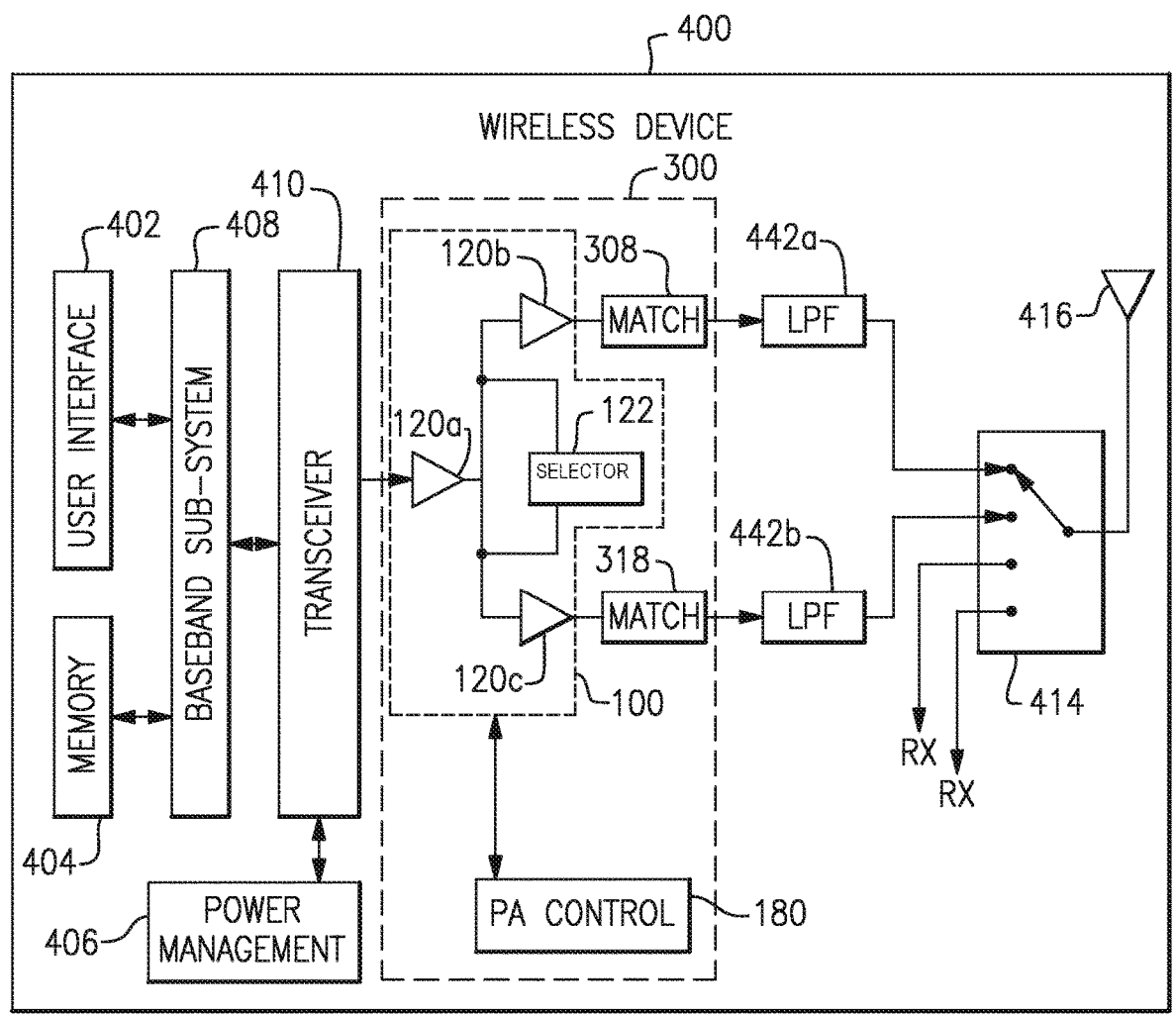
FIG. 9 shows an example wireless device having one or more advantageous features as described herein, implemented in a time-division duplexing (TDD) configuration.

In the example wireless device 400 depicted in FIG. 8, the duplexers 412a and 412b can be included in a frequency-division duplexing (FDD) configuration. FIG. 9 shows that in a wireless device having a time-division duplexing (TDD) configuration, the duplexers may be not be present, and the outputs of the matching circuits 308, 318 can be connected to the switch 414 through, for example, respective low-pass filters (LPF) 442a, 442b. In such a TDD configuration, Rx path(s) can come out of the switch 414. Thus, the switch 414 can act as band selector (e.g., B38 and B40 as described herein), as well as a Tx/Rx (TR) switch.

In the example wireless devices 400 depicted in FIGS. 8 and 9, the example module 300 is depicted as including the PAs 120 and their respective matching circuits 308, 318. In some embodiments, the module 300 of FIG. 8 can include some or all of the duplexers 412 and the switch 414. In some embodiments, the module 300 of FIG. 9 can include some or all of the filters 442 and the switch 414.

In the examples of FIGS. 8 and 9, the wireless devices 400 are described as having FDD and TDD configurations, respectively. In some embodiments, a wireless device can be configured to have a combination of FDD and TDD functionalities.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method for operating an amplifier, the method comprising:
    partially amplifying a signal with a common amplification stage;
    providing a bias signal to a selected one of a plurality of dedicated amplification stages each implemented between the common amplification stage and a respective output node, such that the selected dedicated amplification stage further amplifies the partially amplified signal, the providing of the bias signal including routing of the bias signal through a pole of a switch, a throw of the switch, and the selected dedicated amplification stage corresponding to the throw of the switch; and
    routing the further amplified signal from the selected dedicated amplification stage to the respective output node through a dedicated harmonic trap.

2. The method of claim 1 wherein the providing of the bias signal includes providing the bias signal to an input node of the selected dedicated amplification stage.

3. The method of claim 1 wherein the switch includes a number of throws at least as many as the number of dedicated amplification stages.

4. The method of claim 1 wherein the partially amplifying the signal with the common amplification stage is performing a first stage amplification in a corresponding signal path.

5. The method of claim 4 wherein the further amplifying of the partially amplified signal with the selected dedicated amplification stage is performing a second stage amplification in the corresponding signal path.

6. The method of claim 1 wherein at least one of the partially amplifying of the signal and the further amplifying of the partially amplified signal include power amplification.

7. A method for operating an amplifier, the method comprising:

partially amplifying a signal with a common amplification stage;

providing a bias signal to a selected one of a plurality of dedicated amplification stages each dedicated amplification stage coupled to the common amplification stage without any switch, and also coupled to a respective output node, such that the selected dedicated amplification stage is enabled and further amplifies the partially amplified signal; and routing the further amplified signal from the selected dedicated amplification stage to the respective output node through a dedicated harmonic trap.

8. A method for processing a signal, the method comprising:

partially amplifying an input signal with a common amplification stage;

further amplifying the partially amplified signal with a selected one of a plurality of dedicated amplification stages each dedicated amplification stage coupled to the common amplification stage without any switch and also coupled to a respective output node, the further amplifying including selectively providing a bias signal to enable the selected dedicated amplification stage; and routing the further amplified signal from the selected dedicated amplification stage to the respective output node through a dedicated harmonic trap.

9. The method of claim 8 wherein the partially amplifying and the further amplifying are tailored to support transmission of the further amplified signal.

10. The method of claim 8 wherein the further amplified signal has a gain in power relative to the input signal.

11. The method of claim 8 wherein the routing of the further amplified signal through the dedicated harmonic trap results in removal or reduction of amplitude of a harmonic component from the further amplified signal.

12. The method of claim 8 further comprising providing matching for the further amplified signal.

13. A method for operating a wireless device, the method comprising:

generating or providing a signal;

amplifying the signal, the amplifying including partially amplifying the signal with a common amplification stage, and further amplifying the partially amplified signal with a selected one of a plurality of dedicated amplification stages each dedicated amplification stage coupled to the common amplification stage without any switch and also coupled to a respective output node, the further amplifying including selectively providing a bias signal to enable the selected dedicated amplification stage; and routing the further amplified signal from the selected dedicated amplification stage to the respective output node through a dedicated harmonic trap.

14. The method of claim 13 wherein the partially amplifying and the further amplifying are tailored to support transmission of the further amplified signal.

15. The method of claim 14 further comprising routing the further amplified signal from the respective output node to an antenna for wireless transmission.

16. The method of claim 15 further comprising filtering the further amplified signal prior to transmission by the antenna.

17. The method of claim 15 wherein the routing of the further amplified signal from the respective output node to the antenna includes performing one or more switching operations between the respective output node and the antenna.

* * * * *